United States Patent [19]

Stacey

[11] Patent Number: 5,021,300

[45] Date of Patent: Jun. 4, 1991

[54] SOLDER BACK CONTACT

[75] Inventor: William F. Stacey, Framingham, Mass.

[73] Assignee: Raytheon Company, Lexington, Mass.

[21] Appl. No.: 402,410

[22] Filed: Sep. 5, 1989

[51] Int. Cl.$^5$ .................. H01L 21/283; C25D 3/60
[52] U.S. Cl. ........................... 428/620; 357/71;
428/657; 428/672; 428/674; 437/189; 437/246
[58] Field of Search ............... 428/620, 657, 672, 674,
428/647; 437/189, 246; 357/71

[56] References Cited

U.S. PATENT DOCUMENTS

| | | | |
|---|---|---|---|
| 3,480,412 | 11/1969 | Duffek, Jr. et al. | 428/620 |
| 4,268,585 | 5/1981 | Daur et al. | 428/647 |
| 4,310,569 | 1/1982 | Harrington | 427/189 |
| 4,471,005 | 11/1984 | Cheng et al. | 437/246 |
| 4,511,634 | 4/1985 | Nickol | 428/647 |
| 4,514,751 | 4/1985 | Bhattacharya | 357/71 |
| 4,634,638 | 1/1987 | Ainslie et al. | 428/672 |
| 4,749,628 | 6/1988 | Kadija et al. | 428/647 |
| 4,875,617 | 10/1989 | Citowsky | 357/71 |
| 4,903,110 | 2/1990 | Aono | 357/71 R |
| 4,922,322 | 5/1990 | Mathew | 357/71 |

FOREIGN PATENT DOCUMENTS

| | | | |
|---|---|---|---|
| 0022163 | 2/1979 | Japan | 428/620 |
| 0015235 | 2/1980 | Japan | 428/620 |

*Primary Examiner*—Upendra Roy
*Attorney, Agent, or Firm*—Denis G. Maloney; Richard M. Sharkansky

[57] ABSTRACT

An integral solder back contact is provided over a semiconductor circuit. The solder contact includes a pair of layers which form an alloy at elevated temperatures. A semiconductor device having the integral solder back contact is mounted on the carrier and disposed at an elevated temperature which causes one of the layers to melt. The material of the other layer is dissolved in the melted layer until such melted layer has a sufficient amount of the material of the other layer dissolved therein to form an alloy which hardens. After the alloy hardens the circuit is firmly bonded to the carrier even while the carrier is exposed to the elevated temperature.

14 Claims, 4 Drawing Sheets

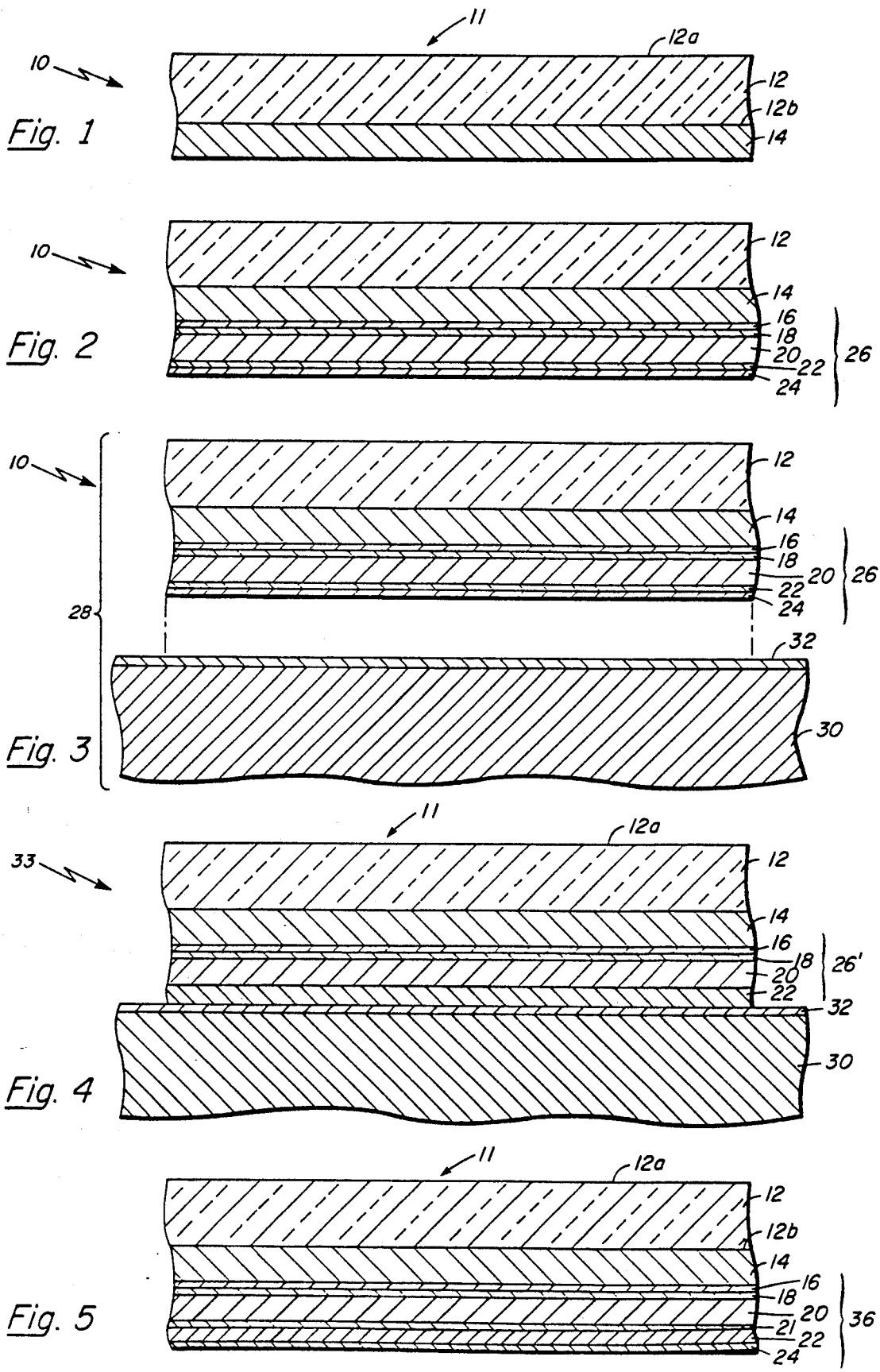

SOLDER BACK CONTACT

BACKGROUND OF THE INVENTION

This invention relates generally to electronic component packaging techniques and more particularly to mounting of electronic devices within a package.

As is known in the art, electronic devices in particular integrated circuits such as monolithic microwave integrated circuits include a semiconductor crystalline substrate such as gallium arsenide, silicon, or other semiconductor materials having disposed over a first surface thereof an electronic circuit manufactured by conventional integrated circuit techniques. Generally, disposed over the opposite surface of the substrate is a back plane conductor which serves as a heat sink and ground plane for the electrical circuit.

In particular, with monolithic microwave integrated circuits (MMIC's) the circuit is bonded to a machined carrier typically comprised of a metal or a dielectric having a metal coating over a surface thereof. The metal carriers are subsequently bonded or packaged into a circuit package. Two techniques are commonly employed to bond MMIC devices to a package. One technique is pretinning in which the package or carrier is provided with a quantity solder. The carrier is heated to remelt the solder as the electronic circuit is placed upon the carrier.

With the second technique, the integrated circuit is soldered to the carrier using a solder pre-form. A solder pre-form is a flat slab of solderable material which is placed between the ground plane conductor of the integrated circuit and the carrier. The carrier is heated to an elevated temperature and slight pressure is brought to bear on the circuit to cause the solder pre-form slab to melt and form a solder bond between the package and the circuit.

Problems with pretinning and the solder pre-form technique are similar. For example, a solder pre-form is often relatively thick and thus the solder pre-form provides a relatively thick solder bond. The solder pre-form also provides a relatively high thermal impedance bond, since typically the material of the solder has a thermal conductivity which is lower than the thermal conductivity of the material of the machined carrier, and the material of ground plane conductor on the substrate of the MMIC. Generally, gold is the material used as the ground plane conductor whereas a gold layer is often provided on the package or carrier.

Furthermore, since the solder pre-form tends to be thick, there is a possibility that excess solder will build up around the outside edges of the chip. This situation provides the potential for a short circuit between the back contact of the integrated circuit and the circuit fabricated on the front side or top portion of the substrate. Moreover, the requirement for applying pressure to the circuit may result in damage to the circuit.

Also, solder pre-form bonds often have inconsistent and unreproducible mechanical characteristics. Such occurrences necessitate addition rework operations which increase the cost of packaging, and have the potential to cause damage to the circuit.

The use of solder pre-forms or pre-tinning also increase the cost of packaging of such electronic circuits, since such solder bonding techniques are labor intensive.

SUMMARY OF THE INVENTION

In accordance with the present invention, a substrate having a pair of opposing surfaces and a heat sink layer disposed over one of said surfaces includes a solder contact disposed over the heat sink layer. The solder contact includes a first layer of a first metal having a first relatively low melting temperature compared to the melting temperature of the heat sink layer. The first metal and the material of the heat sink are selected to be capable of forming a relatively low temperature alloy. With this particular arrangement, an integral, thin solder contact is provided on a first surface of a substrate. This arrangement thus eliminates the need for use of pre-tinning or the relatively thick solder pre-forms. The bond between the substrate and a package will be reproducible and substantially uniform, since the thicknesses of the solder contact can be easily controlled and tailored to the particular substrate. Moreover, the solder contact is provided using automated fabrication techniques. Thus, eliminated are the many hand operations required in bonding the substrate to a package using solder pre-forms or pre-tinning. Accordingly, the cost of assembly will be reduced.

In accordance with a further aspect of the present invention, a substrate having a pair of opposing surfaces, a first one of said surfaces supporting an electronic component includes a solder contact disposed over a second surface of said substrate. The solder contact includes a first layer of a first metal having a first melting temperature and a second layer of a second, different metal having a second relatively low melting temperature compared to the melting temperature of said first metal, with said first metal and said second metal being capable of forming an alloy. With such an arrangement, a solder contact is provided on a semiconductor circuit. The substrate can be bonded by simply placing the substrate on a heated package to cause the second layer to melt and alloy with the first layer. The thickness of the layers can be tailored to the substrate and many manual bonding operations are eliminated. Further, no pressure need be applied to the substrate to initiate the bonding operation.

In an alternate embodiment, a barrier layer is disposed between the first and second layers of the solder contact. The barrier prevents the first and second layers from forming low temperature alloys. Preferably, the barrier layer is a metal selected to be capable of forming a liquidus phase with the second metal such that the liquidus phase of the second metal reaches the metal of the first layer. With such an arrangement, the barrier layer prevents the metals of the first and second layers from alloying together during storage.

In accordance with a still further aspect of the present invention, a method of providing a solder back contact over a substrate comprises the steps of depositing a first layer of a first metal having a first relatively high melting temperature over said substrate and depositing a second layer of a second, different metal having a second relatively low melting temperature compared to the melting temperature of the first metal with said metals be capable of forming relatively low temperature alloys. With this particular arrangement, a solder back contact is provided using automated integrated circuit process steps. These steps eliminate the many manual operations associated with prior solder bonding operations.

BRIEF DESCRIPTION OF THE DRAWINGS

The foregoing features of this invention, as well as the invention itself, may be more fully understood from the following detailed description of the drawings, in which:

FIG. 1 is a cross-sectional view of a typical electronic component such as an integrated circuit having a ground plane conductor;

FIG. 2 is a cross-sectional view of the circuit of FIG. 1 including a solder back contact in accordance with the present invention;

FIG. 3 is an exploded cross-sectional view of the circuit of FIG. 2 being mounted on a conventional carrier;

FIG. 4 is a cross-sectional view of the electronic circuit soldered to the carrier in accordance with an aspect of the present invention;

FIG. 5 is a cross-sectional view of an electronic circuit of FIG. 1 having an alternate embodiment of a solder contact in accordance with a still further aspect of the present invention.

DESCRIPTION OF THE PREFERRED EMBODIMENTS

Figure 6A:
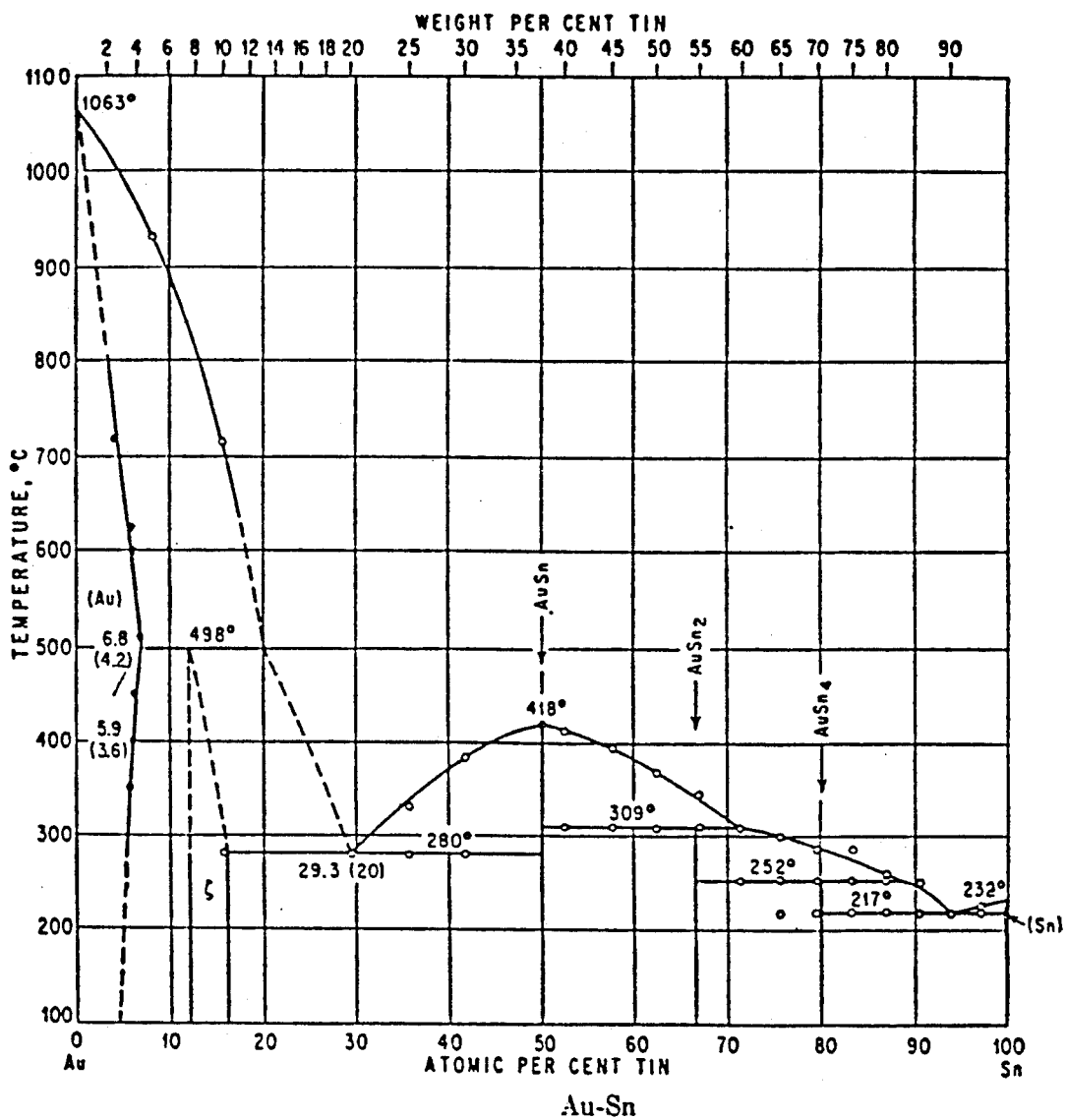
FIGS. 6A-6C are phase diagrams of three different preferred metal alloy systems in accordance with the present invention.

Referring now to FIG. 1, an electronic component 10 includes a substrate 12 here of GaAs having opposing surfaces 12a and 12b and carrying over surface 12a an integrated circuit 11 such as a monolithic microwave integrated circuit or other electronic circuits or devices as would be desired by one of skill in the art. Disposed over surface 12b of substrate 12 is a back electrical and thermal contact 14 comprised of here a highly thermally and electrically conductive metal such as gold.

Fabrication of a solder back contact will be described below. Discussion of the process to provide such a contact will proceed from the assumption that the back surface of the substrate 12b is processed after the integrated circuit 11 is provided over the front surface. This sequence is the preferred sequence but not necessarily the only sequence.

Referring now to FIG. 2, a solder back contact 26 is shown disposed over the back contact 14. Preferably, the solder back contact includes sequentially deposited layers as shown. The solder back contact 26 thus includes an optional, flash layer 16 of the same material as the ground plane conductor 14 which is used to prepare the surface of ground plane conductor 14 for deposit of subsequent layers. Layer 16 is preferred but not necessary in order to practice the invention. Flash layer 16 has a typical thickness of about 0 microns to 0.8 microns. Disposed over layer 16 is an optional barrier layer 18 here comprised of a material such as nickel which prevents interdiffusion between the subsequent layers to be described and the ground plane layer 14. Barrier layer 18 has a typical thickness of about 0 microns up to 2 microns. Preferably, disposed over barrier layer 18 is a first optional alloy component metal such as copper or gold here deposited to a preferred thickness of 7-12 microns. Disposed over the first alloy component layer 20 is a second alloy component layer 22 here comprised of a relatively low melting temperature metal such as tin or cadmium. Layer 22 has a thickness of 1 to 12 microns or more and a preferred thickness generally in the range of about 1.5-2.5 microns. An optional anti-oxidation layer 24 is preferably disposed over the second alloy component layer 22 particularly if said layer is comprised of tin to prevent oxidation of the otherwise exposed tin layer.

Layers 16-24 are each deposited sequentially using any desired deposition technique such as sputtering, evaporation, electrolessly plating or as here electroplating. Here for each of the sequentially deposited layers, the substrate 12 having ground plane conductor 14 is disposed in a suitable plating solution (not shown) containing the desired end product metal. The metal is deposited by sequentially electroplating it using conventional techniques. After each plating step, the substrate is washed in deionized water between metal platings but is not allowed to dry. For the final anti-oxidation layer, it is generally preferred to initially electrolessly plate a thin deposit of the anti-oxidant material such as gold over the second alloy component layer 22. After the initial electrolessly plating, the anti-oxidation layer 24 is provided to its final thickness by electroplating.

A preferred example of the solder back contact as described in conjunction with FIG. 2 includes layer 16 comprised of gold having a thickness of 0.8 microns, layer 18 comprised of nickel having a thickness of 1.5 microns, layer 20 comprised of gold having a thickness of 10 microns, layer 22 comprised of tin having a thickness of 2 microns, and layer 24 comprised of gold having a thickness of 0.4 microns. These layers are sequentially deposited using electroplating techniques except for layer 24 which is initially deposited using electrolessly plating techniques followed by a short gold electroplate to provide the desired thickness of 0.4 microns. The thicknesses of the above layers were chosen to provide a relatively strong solder bond having a relatively low thermal resistance as would be desired for applications involving monolithic microwave integrated circuits.

Referring now to FIG. 3, the electronic circuit 10 having the solder back contact 26 is mounted to a conventional metalized or metal carrier 30. Typically, such carrier 30 which may be a separate machined carrier or part of a semiconductor package is comprised of a thermally conductive material such as a suitable dielectric material or as more commonly used a machined metal such as brass. Disposed over the mounting surface of said carrier 30 is here a thin metal layer 32 of a highly thermally conductive metal such as gold having a desired thickness here in the range of about 2-8 microns.

The circuit having the solder back contact 26 is then disposed on carrier 30 which is preheated to a temperature of here about 290° C. As the substrate 12 is placed smoothly into position without pressure being applied to the chip, the tin layer 22 begins to melt and as it melts, it soaks up gold from the adjacent layers 20 and 24, and layer 32 on the carrier. The tin and gold continue to alloy together until the temperature of the alloy has a melting point of approximately 290° C. at which point no more gold can be dissolved into the tin. Thus, a gold-tin alloy is provided. The alloy hardens leaving the substrate 12 soldered in place on the carrier 30. The soldering operation occurs over a period of several seconds.

The solder back contact 26 provides an extremely uniform solder layer between the ground plane 14 and the package 30. The solder layer is also relatively thin. The solder joint 22' (FIG. 4) is thus also relatively thin which provided a relatively low thermal resistance contact. The joint 2' also avoids the tendency for excess material to appear around the outside edges of the integrated circuit 11. Thus, the potential of a short circuit caused by solder build-up is prevented.

Referring now to FIG. 4, the package semiconductor device 33 is shown to include the circuit 11 mounted over substrate 12 having a solder contact 26'. Said solder contact 26' after being soldered to the package 30 is comprised of the optional flash layer 16, the optional barrier layer 18, a solder contact 22' comprised of a gold-tin alloy and the metal layer 32 having reduced thickness comprised principally of gold. Thus, layer 22' includes portions of layer 20, layer 24, and portions of layer 32 which having previously been comprised of gold are dissolved with the tin layer 22 (FIG. 3) to provide the tin-gold alloy used to form the solder connection between the circuit 10 and the package 30.

Other bonding systems may alternatively be used to form the solder back contact 26. For example, layer 20 may be comprised of copper and layer 22 be comprised of tin. This system may be preferable to the gold tin system described above, since there is less likelihood of copper interdiffusion with the gold at room temperature. Accordingly, a storage life problem which may exist under certain circumstances with the gold-tin alloy system is not a problem with the copper tin alloy system.

A second alternative system which can be used to provide the solder back contact is to provide layer 20 of gold and layer 22 of cadmium. Cadmium has a relatively low initial melting temperature compared to that of gold, melting around 309° C. The initial temperature at which the carrier must be maintained to initiate melting of the cadmium layer is thus slightly higher, typically 330°, than the corresponding temperature in the tin based system. Nevertheless, as the cadmium layer 22 melts, it will soak up gold from adjacent layers 20, 24, and 32 until such layer provides an alloy layer comprised of typically 10% gold and 90% cadmium. Cadmium is thus an alternative low melting metal to tin. It appears that cadmium will have less of a tendency to form low temperature alloys with gold as does tin. The problem with cadmium, however, is that it is well known to be a hazardous material and thus care must be exercised in its use.

Referring now to FIG. 5, an alternate embodiment of the invention is shown to include circuit 11 disposed over the front surface 12a of a substrate 12, and having on a back surface 12b thereof, an electrical/thermal contact 14 here comprised of gold as described above in FIG. 1. Disposed on contact 14 is optional gold flash layer 16, optional barrier layer 18, a first alloy component layer 20, a second barrier layer 21, a second alloy component layer 22, and an optional flash layer 24. Here sequentially deposited preferably plated, layers 16, 18, 20, 21, 22, and 24 and in particular layers 20, 21 and 24 provide a solder back contact 36. Solder back contact 36 is thus identical to solder back contact 26 of FIG. 2 except for the inclusion of second barrier layer 21. Barrier layer 21 is here comprised of a material such as copper which would prevent interdiffusion even at room temperature between layer 20 and layer 22. Thus, this would reduce the effects of the shelf life problem mentioned above in conjunction with FIG. 2 for the gold-tin system. Copper layer 21 here has a thickness in the range of 0.1 to 0.5 microns. This diffusion barrier layer is comprised of a metal which will form a liquidus phase with tin so that a liquid tin phase will contact the gold layers.

Figure 6B:
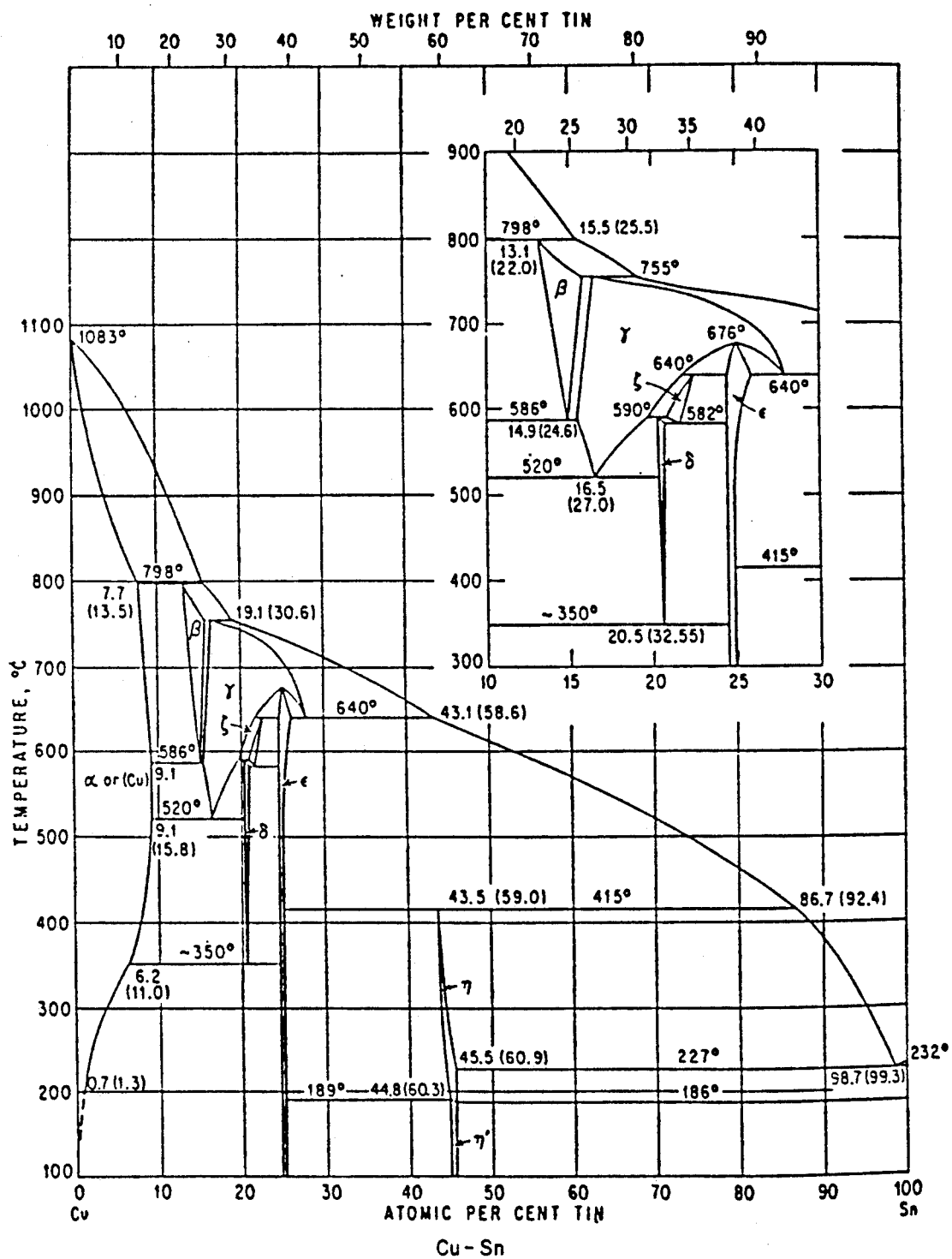
Figure 6C:
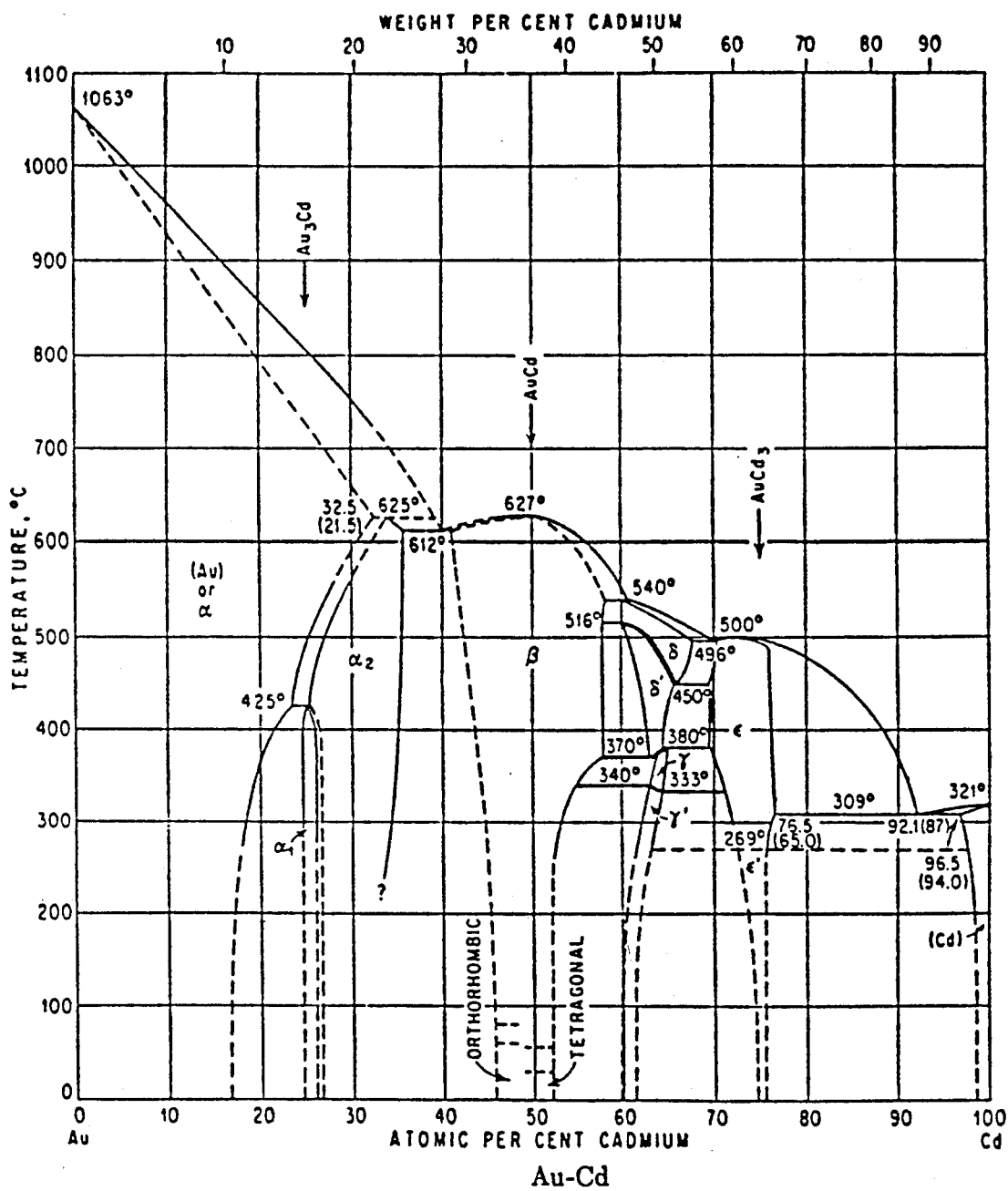

Referring now to FIGS. 6A-6C, the phase diagrams for preferred alloy systems to provide solder back contact 26 are shown. As shown in FIG. 6A, for the gold-tin alloy system (Au—Sn) gold-tin form relatively low temperature alloys i.e. at temperatures below about 310° C. Thus, in normal mounting operations where a carrier is disposed at elevated temperature of typically about 290° C., the tin melts initially at approximately 232° C. and quickly forms an eutectic at 227° C. having an approximate composition of 94% tin and 6% gold. The mounting operation continues and the amount of gold soaked up by the tin increases until the solder contact reaches the stable temperature of the carrier here 290° C. and solidifies. This occurs at point 60. The composition of the solder contact is approximately 76% Sn and 24% Au. Generally, such contacts will have compositions of more than 50% tin, up to 94% tin the balance gold. The composition depends on the temperature of the carrier. Typical temperature ranges thus are about 232° C. to about 400° C. Preferred temperatures are 280° C. to 320° C. If the temperature is kept below the peak on the phase diagram which occurs at 418° C., then the alloys should never reach the second eutectic point which occurs at 280° C. at a composition of approximately 29% atomic tin and 71% atomic gold. Although it is not necessarily important to avoid this second eutectic point, it is desirable to avoid elevated temperatures of 418° C. which could result in possible damage to the circuits particularly if such circuits are comprised of materials such as GaAs. It is believed that optimal results are obtained if the solder process occurs relatively quickly, thereby preventing the tin from interdiffusing with the gold which could prevent a tin liquidus phase from contacting the gold.

Interdiffusion could also occur at room temperature over prolong periods of storage. To alleviate the problem of storage shelf life, it is preferred to use one of the alternative alloy systems mentioned above, or preferably provide a second barrier layer 21 of another metal between the gold and tin to prevent interdiffusion, as explained above for FIG. 5.

Referring now to FIG. 6B, a phase diagram for the copper tin system is shown. During mounting of a solder contact employing a copper-tin system, the carrier 30 (FIG. 3) is again heated to a predetermined temperature here approximately 290° C. generally in the range of 232° to about 500°c., preferably in the range of 280° C. to 320° C. Thus, the composition would range between about 70% to 99% tin, the balance copper. The substrate having the solder contact is placed on the carrier and quickly the tin melts initially at a temperature of again here 232° C. forms an eutectic at 227° C. and then continues to soak copper and hardens until it reaches the stable temperature of the carrier here 290° C. At this point, the composition be approximately 95% tin and 5% copper.

Referring now to FIG. 6C, a phase diagram for the gold cadmium system is shown. The mounting operation in the gold cadmium system proceeds in a similar manner as that described above for the other systems. Here, the carrier 30 (FIG. 3) is heated to a stable temperature in the range of about 321° C. to 500° C preferable in the range of 350° C. to 370° C. This would correspond to a composition range of 70% to 92% Cd the balance gold. At the stable temperature of the carrier here 360° C., the cadmium begins to melt at 321° C. and forms an eutectic at approximately 309° C. having a composition of approximately 92% cadmium and 8% gold. The sequence continues as the alloy continues to soak up gold until it reaches the stable temperature of the carrier, here 360° C. at which point the composition of the alloy is approximately 91% Cd, 9% Au.

For the solder contact as describd in conjunction with FIG. 5, the alloy system which is formed is a gold-copper-tin alloy. Although a phase diagram is not provided for the gold-copper-tin alloy system, it is believed that the process proceeds by copper forming a liquidus state with the tin so that during the mounting operation, a liquid tin phase will reach the gold layers and form an alloy with gold as described in conjunction with FIG. 6A. Typical alloy compositions for this system would be 70% to 99% tin, 0.1% to 29.9% Cu, the balance gold. The phase diagrams of FIGS. 6A to 6C were derived from a book entitled "Constitution of Binary Alloys" by Hansen.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. In combination:
   a semiconductor substrate having a pair of opposing surfaces, a semiconductor circuit disposed over a first surface, and a contact comprised of gold disposed on a second one of said surfaces; and
   a layer of cadmium disposed over the contact.

2. In combination:
   a semiconductor substrate having a pair of opposing surfaces, a first one of said surfaces supporting an electronic component; and
   a solder contact disposed over a second surface of said substrate, said solder contact comprising:
   a first barrier metal layer disposed over said second surface;
   a first layer of a first metal having a first melting temperature; and
   a second layer of a second, different metal having a second relatively low melting temperature compared to the melting temperature of said first metal, with said first metal and said second metal being capable of forming an alloy; and
   a second barrier metal layer disposed between said first layer of first metal and second layer of the second metal of the solder contact.

3. The combination of claim 2 wherein said first barrier layer is nickel and has a thickness in the range of about 0.5 microns to 2.0 microns.

4. The combination of claim 2 wherein said first layer is gold and has a thickness in the range of about 5 microns to 10 microns.

5. The combination of claim 2 wherein said second layer is tin and has a thickness in the range of about 1.5 microns to 2.5 microns.

6. The combination as recited in claim 2 wherein said second barrier metal layer is copper.

7. The combination of claim 2 further comprising a third layer of said first metal disposed over the second layer to prevent oxidation of said second layer.

8. The combination of claim 7 wherein said first metal of the first and third layers is gold and said second metal of the second layer is tin.

9. The combination of claim 8 wherein said second barrier layer has a thickness in the range of 0.1 microns to 0.5 microns.

10. In combination:
    a circuit having a first surface and a metallic contact on said first surface;
    a carrier having a first surface;
    a solder joint disposed between said first surfaces of said circuit and carrier comprising:
    a first layer comprised principally of a first metal selected from the group consisting of gold and copper; and
    a second layer comprised of an alloy of said first metal and tin with the composition of said alloy being approximately 50% to 94% atomic tin, the balance the selected first metal.

11. The combination of claim 10 wherein said alloy is gold-tin has an approximate composition range of atomic tin of about 50% to 94%, the balance atomic gold.

12. The combination of claim 10 further comprising copper incorporated into said alloy of said second layer and wherein said alloy is gold-tin-copper and has an approximate composite range of atomic tin of about 70% to 99%, atomic copper 0.1% to 29.9 %, the balance atomic gold.

13. The combination of claim 10 wherein said alloy is copper-tin and has an approximate composition range of atomic tin of about 70% to 99%, the balance atomic copper.

14. In combination:
    a circuit having a first surface and a metallic contact on said first surface;
    a carrier having a first surface;
    a solder joint disposed between said first surfaces of said circuit and carrier comprising:
    a first layer comprised principally gold; and
    a second layer comprised of an alloy of said gold and cadmium;
    wherein said alloy has an approximate composition range of atomic cadmium of about 70% to 92%, the balance atomic gold.

* * * * *